United States Patent
Koyama et al.

(10) Patent No.: US 7,396,199 B2
(45) Date of Patent: Jul. 8, 2008

(54) SUBSTRATE PROCESSING APPARATUS AND SUBSTRATE PROCESSING METHOD

(75) Inventors: Yoshihiro Koyama, Kyoto (JP); Yasuhiro Mizohata, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 125 days.

(21) Appl. No.: 10/329,667

(22) Filed: Dec. 23, 2002

(65) Prior Publication Data

US 2003/0123971 A1 Jul. 3, 2003

(30) Foreign Application Priority Data

Dec. 28, 2001 (JP) ............................. 2001-401198

(51) Int. Cl.
*H01L 21/677* (2006.01)
(52) U.S. Cl. ............. 414/222.01; 414/217; 414/222.05; 414/222.06; 414/937; 414/941
(58) Field of Classification Search ............ 414/222.01, 414/222.07, 222.08, 222.12, 222.13, 223.01, 414/223.02, 225.01, 226.01, 226.05, 744.3, 414/744.5, 217, 936, 937, 941
See application file for complete search history.

(56) References Cited

U.S. PATENT DOCUMENTS

| 5,339,128 | A | * | 8/1994 | Tateyama et al. | ............ | 396/604 |
| 5,442,416 | A |   | 8/1995 | Tateyama et al. | ............ | 354/319 |
| 5,443,346 | A | * | 8/1995 | Murata et al.   | ..........  | 414/222.13 |
| 5,553,396 | A | * | 9/1996 | Kato et al.     | ...........  | 34/406 |
| 5,746,565 | A | * | 5/1998 | Tepolt          | ..............  | 414/744.5 |
| 5,963,753 | A | * | 10/1999 | Ohtani et al.  | ............  | 396/611 |
| 5,996,241 | A | * | 12/1999 | Thompson et al.| ............  | 34/58 |
| 6,062,798 | A | * | 5/2000 | Muka            | ................  | 414/416.03 |
| 6,168,667 | B1| * | 1/2001 | Yoshioka        | ..............  | 118/715 |
| 6,234,738 | B1| * | 5/2001 | Kimata et al.   | ..........  | 414/416.03 |
| 6,258,220 | B1|   | 7/2001 | Dordi et al.    | .............  | 204/198 |
| 6,672,820 | B1| * | 1/2004 | Hanson et al.   | ........  | 414/222.06 |
| 6,772,493 | B2| * | 8/2004 | Yamanashi et al.| .........  | 29/33 P |

FOREIGN PATENT DOCUMENTS

| JP | 2132840   | 5/1990 |
| JP | 5178416   | 7/1993 |
| JP | 7-7066    | 1/1995 |
| JP | 9-275127  | 10/1997 |
| JP | 11-347925 | 12/1999 |

OTHER PUBLICATIONS

Japanese Office Action issued Nov. 21, 2006.
Japanese Office Action issued Jul. 17, 2007.

* cited by examiner

*Primary Examiner*—Saul J. Rodriguez
*Assistant Examiner*—M. S Lowe
(74) *Attorney, Agent, or Firm*—Ostrolenk, Faber, Gerb & Soffen, LLP (57) ABSTRACT

A substrate processing apparatus for processing a substrate while transferring the substrate among a plurality of units with which the substrate is to be processed or on which the substrate is to be placed. This apparatus is provided with: a first unit group disposed along a linear first line; a second unit group disposed along a linear second line crossing the first line at a predetermined angle; and a transfer robot capable of transferring and receiving a substrate to and from the first unit group and the second unit group.

5 Claims, 6 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus for and a substrate processing method of executing processings on any of a variety of substrates such as a semiconductor wafer, a liquid-crystal-display-device glass substrate, a plasma-display glass substrate, an optical-disk substrate, a magnetic-disk substrate, a photomagnetic-disk substrate, a photomask substrate and the like.

2. Description of Related Art

In production of a semiconductor device or a liquid crystal display device, there is used a substrate processing apparatus for executing, on a substrate (semiconductor wafer or glass substrate), a variety of processings such as a plating processing, a resist coating processing, a cleaning processing and the like.

Such a substrate processing apparatus is formed for example by an indexer section in which a substrate is carried in/out from a cassette capable of housing a plurality of substrates, and a substrate processing section having a plurality of processing units, both sections being connected to each other.

The indexer section comprises (i) a cassette placing portion in which a plurality of cassettes can be placed as arranged in a predetermined cassette aligning direction, and (ii) an indexer robot linearly movable back and forth in the cassette aligning direction for carrying a substrate in/out from a cassette.

The substrate processing section comprises (i) a main transfer robot arranged to travel, for example, in a horizontal direction at a right angle to the cassette aligning direction, and (ii) a plurality of processing units disposed along the transfer passage of the main transfer robot. The main transfer robot has access to any of the processing units for carrying an unprocessed/processed substrate in/out from the processing unit.

An unprocessed substrate is taken out from a cassette placed in the cassette placing portion and transferred to the main transfer robot by the indexer robot. The main transfer robot is moved to a processing unit. First, the main transfer robot carries out a processed substrate from the processing unit and then carries the unprocessed substrate therein. While holding the substrate to which a series of processings have been completed, the main transfer robot is moved in the vicinity of the indexer section and transfers this processed substrate to the indexer robot. The indexer robot houses this processed substrate in a cassette.

The conventional substrate processing apparatus having the arrangement above-mentioned, is provided with two transfer robots, i.e., the indexer robot and the main transfer robot. This makes the apparatus complicated in arrangement, thus accordingly increasing the production cost thereof. Further if one of the two transfer robots gets out of order, any substrate cannot be processed. This is disadvantageous also in reliability.

Further, it is required to transfer a substrate between the indexer robot and the main transfer robot. This results in a variety of problems as follows.

For example, the main transfer robot and the indexer robot must be matched in operational timing. It becomes however complicated to program such that the two robots are operated in good timing.

Further, a substrate comes in contact with the respective substrate holding hands of the indexer robot and the main transfer robot, and there is an instance where a substrate is temporarily placed on a placing stand when transferring/receiving the substrate between the robots. This causes the substrate to repeatedly come in contact with a number of members. This accordingly increases the chances of particles occurring and attaching to the substrate. Thus, the substrate is disadvantageously easily contaminated.

Further, after a substrate has been transferred/received, the substrate is required to be positioned in the transfer robot which has received the substrate. At this time, the guide member on the holding hand and the substrate end face inevitably rub together, and the substrate holding hand and the substrate back face inevitably rub together. This disadvantageously generates particles to contaminate the substrate.

SUMMARY OF THE INVENTION

It is an object of the present invention to provide a substrate processing apparatus having units arranged along two straight lines crossing each other, the substrate processing apparatus being simplified in arrangement, thus reducing the production cost thereof.

It is another object of the present invention to provide a substrate processing apparatus which eliminates the transfer of a substrate between two transfer robots, thus not only simplifying the operation of a single transfer robot, but also reducing the chances of the substrate being contaminated.

It is a further object of the present invention to provide a substrate processing method which eliminates the transfer of a substrate between two transfer robots, thus not only simplifying the operation of a single transfer robot, but also reducing the chances of the substrate being contaminated.

The present invention provides a substrate processing apparatus for processing a substrate while transferring the substrate among a plurality of units with which the substrate is to be processed or on which the substrate is to be placed. This apparatus comprises: a first unit group disposed along a linear first line; a second unit group disposed along a linear second line crossing the first line at a predetermined angle; and a transfer robot capable of transferring and receiving a substrate to and from the first unit group and the second unit group.

According to the present invention, the transfer robot can transfer and receive a substrate to and from the first and second unit groups respectively disposed along the linear first and second lines crossing each other. Accordingly, there are not individually disposed a transfer robot which has access to the first unit group, and a transfer robot which has access to the second unit group. This eliminates the transfer of a substrate between two transfer robots. This not only simplifies the arrangement of the apparatus, but also improves the reliability thereof. Further, this reduces the chances of the substrate being contaminated. A good substrate processing can therefore be executed. Further, it is not required to match two transfer robots with each other in operational timing. This simplifies the operation of the transfer robot to facilitate programming therefor.

The first and second lines may cross each other at an angle of about 90°.

The first unit group may comprise a cassette placing unit on which to be placed is a cassette capable of housing substrates. In such a case, the second unit group preferably comprises a processing unit for executing a processing on a substrate.

Preferably, the transfer robot comprises a rail so disposed as to swing along a plane including the first and second lines, and a robot main body arranged to travel on the rail.

According to the arrangement above-mentioned, the movement of the transfer robot along one of the first and second lines, is achieved by moving the robot main body on the rail, and the movement of the transfer robot along the other of the first and second lines, is achieved by swinging this rail.

More specifically, there may be disposed (i) a robot-main-body-movement drive mechanism for moving the robot main body on the rail disposed, for example, substantially along the second line, and (ii) a swinging drive mechanism for swinging the rail around a position, for example, on the second line or in the vicinity thereof.

For example, when the second line is connected to the first line at its intermediate portion substantially at a right angle thereto, one end of the rail may be disposed in the vicinity of the first line, and the rail swinging fulcrum may be disposed in the vicinity of the other end of the rail. According to such an arrangement, the robot main body can be moved along the first line by swinging the rail with the robot main body positioned in the vicinity of the one end of the rail.

More preferably, provision may be made such that the rail swinging fulcrum is movable along the second line and that the swinging drive mechanism moves the one end of the rail along the first line. According to such an arrangement, the robot main body can be so moved as to draw a linear locus along the first line.

The transfer robot may be of the vertical multiarticular arm type and may comprise: a transfer stand; a first arm connected to the transfer stand in a manner rotatable around a first horizontal axis of rotation extending in a substantially horizontal direction; a first drive source for rotationally driving the first arm; a second arm connected to the first arm in a manner rotatable around a second horizontal axis of rotation substantially parallel to the first horizontal axis of rotation; a second drive source for rotationally driving the second arm; and a substrate holding mechanism connected to the second arm in a manner rotatable around a third horizontal axis of rotation substantially parallel to the first horizontal axis of rotation.

According to the arrangement above-mentioned, the first drive source and the second drive source can independently drive the first arm and the second arm around the first horizontal axis of rotation and the second horizontal axis of rotation, respectively. Accordingly, the substrate holding mechanism can be moved in a horizontal direction and in a vertical direction at right angles to the first and second horizontal axes of rotation. The substrate holding mechanism can be rotated around the third horizontal axis of rotation with respect to the second arm. The substrate holding mechanism can therefore maintain its posture (which holds a substrate, for example, horizontally) regardless of the movements of the first and second arms.

The transfer robot having the arrangement above-mentioned enables its access position to be moved in a direction along one of the first and second lines. The access position of the transfer robot in a direction along the other of the first and second lines, can be moved by making the transfer stand movable along the one of the first and second lines. More specifically, such a movement can be achieved by moving the transfer stand, for example, along the rail.

Preferably, the substrate holding mechanism is rotatable around a perpendicular axis of rotation. This facilitates the access of the substrate holding mechanism to the first and second unit groups disposed along the first and second lines.

The transfer robot is of the horizontal multiarticular arm type and comprises: a transfer stand; a first arm connected to the transfer stand in a manner rotatable around a first perpendicular axis of rotation extending in a substantially perpendicular direction; a first drive source for rotationally driving the first arm; a second arm connected to the first arm in a manner rotatable around a second perpendicular axis of rotation extending in a substantially perpendicular direction; a second drive source for rotationally driving the second arm; a substrate holding mechanism connected to the second arm in a manner rotatable around a third perpendicular axis of rotation extending in a substantially perpendicular direction; and a third drive source for rotationally driving the substrate holding mechanism.

According to the arrangement above-mentioned, the first drive source and the second drive source can independently drive the first arm and the second arm around the first perpendicular axis of rotation and the second perpendicular axis of rotation, respectively. Accordingly, the substrate holding mechanism can be moved in a horizontal plane. This enables the substrate access position of the transfer robot to be moved along the first line and the second line. It is noted that the robot main body is not necessarily moved along the rail. Provision may be made such that the transfer stand is movable along one of the first and second lines. Such an arrangement is advantageous in that the access range along one of the first and second lines is broadened.

The substrate holding mechanism is connected to the second arm in a manner rotatable around the third perpendicular axis of rotation. Accordingly, the substrate holding mechanism can be oriented in a desired direction independently from the horizontal rotational movements of the first and second arms.

Preferably, there is further disposed a vertically driving mechanism for vertically moving the substrate holding mechanism. This not only facilitates transferring and receiving a substrate to and from the first and second unit groups, but also enables a substrate to be transferred and received to and from a unit located in a position higher or lower than the substrate holding mechanism.

The vertically driving mechanism may be arranged to vertically move the transfer stand, to vertically move the first arm with respect to the transfer stand, to vertically move the second arm with respect to the first arm, or to vertically move the transfer stand with respect to the second arm.

Preferably, the substrate holding mechanism has a plurality of substrate holding hands. For example, a pair of substrate holding hands may be disposed and arranged such that one substrate holding hand carries out a substrate from a unit while the other substrate holding hand carries a substrate in the unit. Such an arrangement can quickly exchange substrates to improve the substrate processing efficiency.

More specifically, the substrate holding mechanism may be provided with substrate holding hands and an advance/retreat drive mechanism for advancing/retreating the substrate holding hands with respect to a unit.

A substrate processing method according to the present invention comprises the steps of: disposing, along a linear first line, a first unit group comprising a unit with which a substrate is to be processed or on which a substrate is to be placed; disposing, along a linear second line crossing the first line at a predetermined angle, a second unit group comprising a unit with which a substrate is to be processed or on which a substrate is to be placed; and processing a substrate while transferring the substrate among a plurality of units disposed at the first and second unit groups by a transfer robot capable of transferring and receiving the substrate to and from the first and second unit groups.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
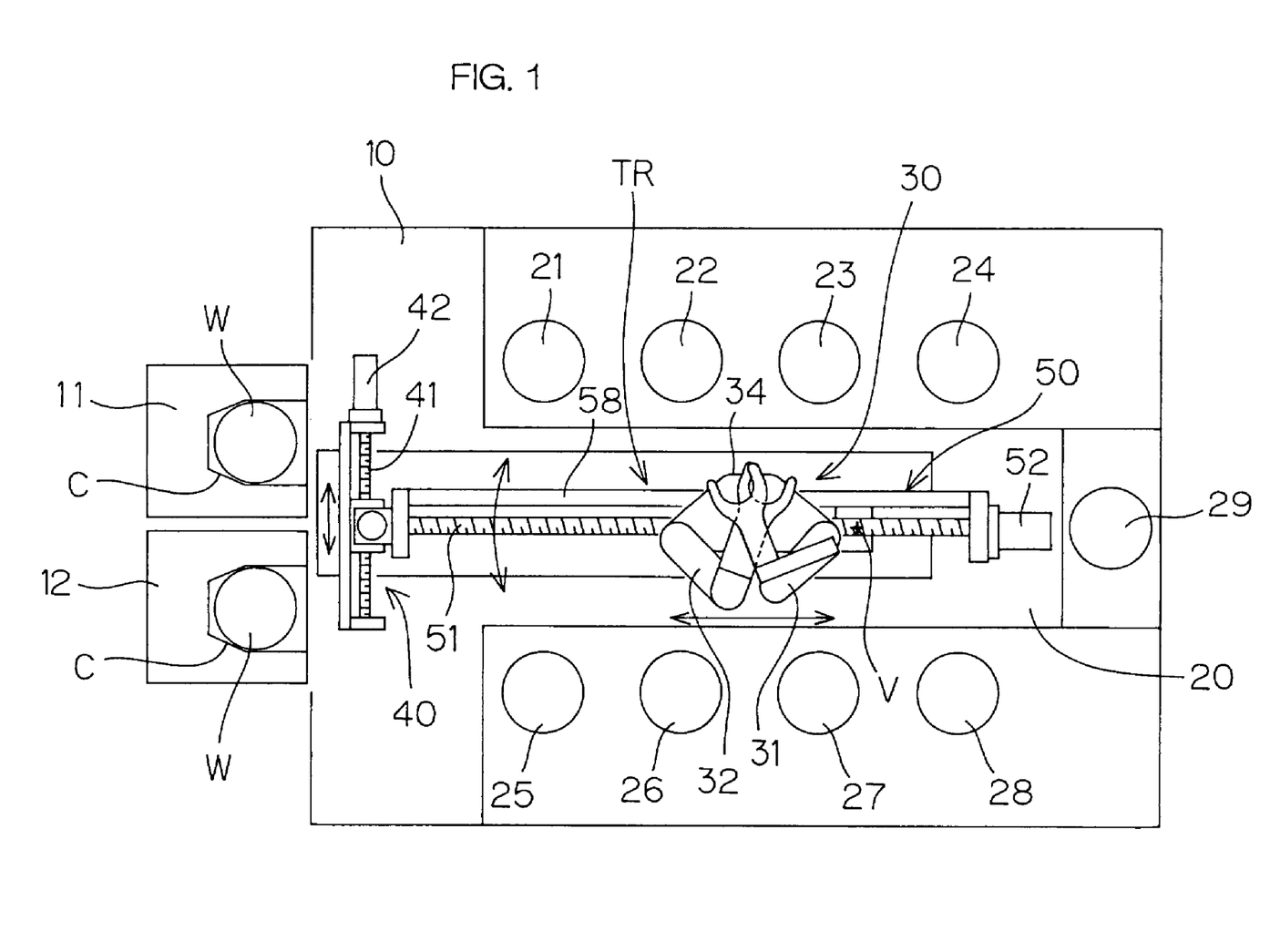
FIG. 1 is a schematic plan view illustrating the arrangement of a substrate processing apparatus according to an embodiment of the present invention.

FIG. 1 is a schematic plan view illustrating the arrangement of a substrate processing apparatus according to an embodiment of the present invention. This substrate processing apparatus is arranged to plate the surface of a substrate W such as a semiconductor wafer or the like with a metallic thin film such as a copper thin film or the like, and then to clean the substrate W.

Along a horizontal linear first transfer passage 10, there are disposed a plurality of cassette placing units 11, 12 in each of which there is placed a cassette C capable of housing substrates W.

On the other hand, a linear second transfer passage 20 is formed in a horizontal direction at a right angle to the first transfer passage 10. In this embodiment, this second transfer passage 20 extends from the first transfer passage 10 substantially at its intermediate position. A plurality of processing units are disposed along the second transfer passage 20 at both sides thereof. More specifically, at one side of the second transfer passage 20, there are disposed a plurality of plating processing units 21~24 for plating the surface of the substrate W with metallic plating, and at the other side of the second transfer passage 20, there are disposed back-face cleaning units 25, 26 for cleaning the back face of a substrate W and periphery cleaning units 27, 28 for cleaning the periphery of the substrate W. There is also disposed a buffer unit 29 in which a substrate W is to be temporality placed. It is a matter of course that, instead of this buffer unit 29, there may be disposed a processing unit for executing, on a substrate W, a processing using a processing solution or the like.

Each of the plating processing units 21~24 comprises, for example, a plating tank which houses a plating solution, a substrate holding mechanism which holds a substrate W with its surface immersed in the plating solution in the plating tank, an electrode disposed therein, and an electrode so disposed as to come in contact with a substrate W. According to this arrangement, when a voltage is applied across the electrodes, a metallic plating layer is formed on the surface of the substrate W. To form a uniform thin film on the surface of the substrate W, the substrate W is preferably rotated around the axis thereof.

The first transfer passage 10 and the second transfer passage 20 form a T-shape transfer passage. A single transfer robot TR is disposed in this T-shape transfer passage. The robot main body 30 of the transfer robot TR is arranged to transfer a substrate W along both the first transfer passage 10 and the second transfer passage 20. Accordingly, the robot main body 30 has access to a cassette C placed on the cassette placing unit 11, 12, and can carry a substrate W in and out from the cassette C. Also, the robot main body 30 has access to any of the plating processing units 21~24, the back-face cleaning units 25, 26, the periphery cleaning units 27, 28 and the buffer unit 29, in and out from which the robot main body 30 can carry a substrate W.

After the robot main body 30 carries out an unprocessed substrate W from a cassette C, the robot main body 30 moves to the front of one of the plating processing units 21~24 and then carries out a processed substrate W therefrom. Thereafter, the robot main body 30 carries the unprocessed substrate W in the plating processing unit 21~24.

Then, the robot main body 30 carries the processed substrate W thus carried out from the plating processing unit 21~24, to one of the back-face cleaning units 25, 26. Before this carrying-in, the robot main body 30 carries out a back-face-cleaning processed substrate W from the back-face cleaning unit 25, 26. Then, the robot main body 30 travels in the second transfer passage 20 while holding the processed substrate W thus carried out, and then carries this processed substrate W in one of the periphery cleaning units 27, 28. Before this carrying-in, the robot main body 30 carries out a processed substrate W from the periphery cleaning unit 27, 28.

While holding this processed substrate W, the robot main body 30 travels in the second transfer passage 20 toward the first transfer passage 10. When the robot main body 30 reaches the first transfer passage 10, the robot main body 30 then moves therealong and stops at the front of a cassette C placed on any of the cassette placing unit 11, 12. Then, the robot main body 30 carries the processed substrate W in this cassette C.

Figure 2A:
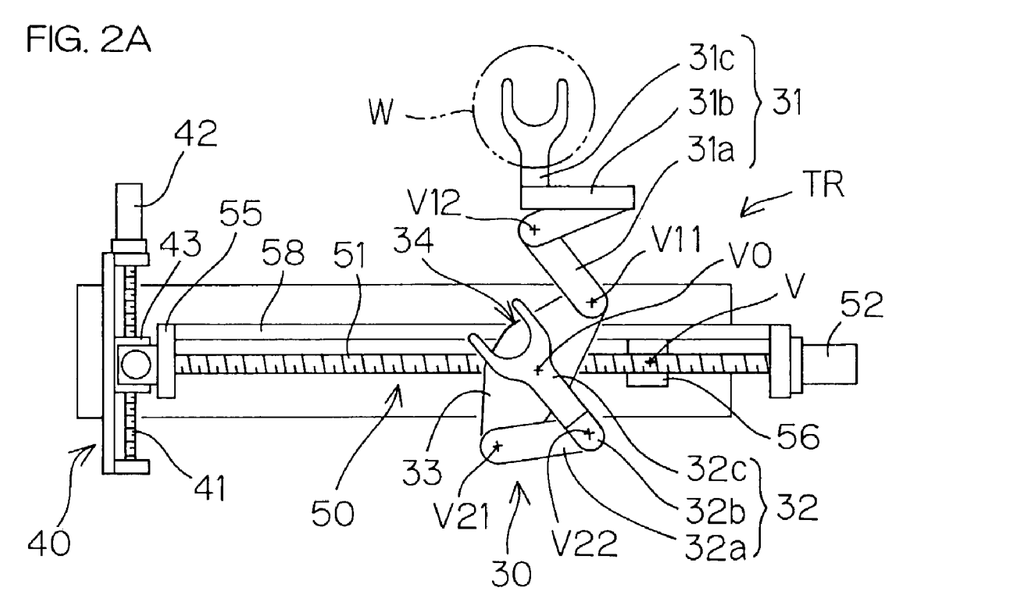
FIG. 2A and FIG. 2B are views illustrating an example of the arrangement of a transfer robot to be used in a substrate processing apparatus according to a first embodiment of the present invention.
Figure 2B:
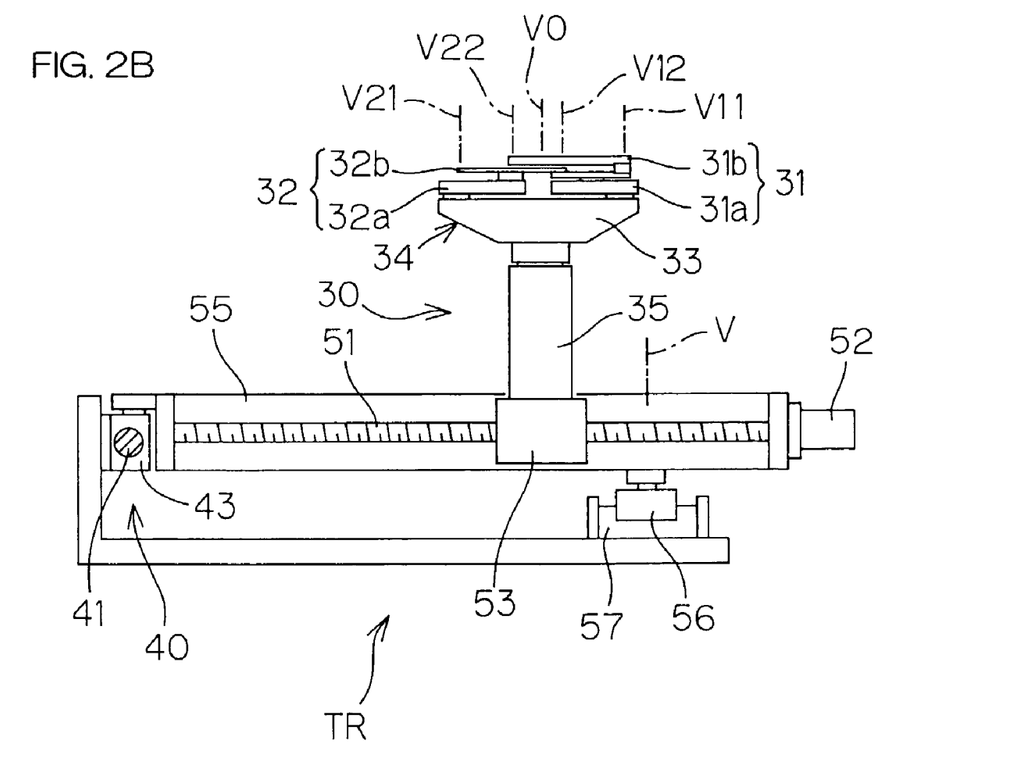

FIG. 2A is a plan view illustrating an example of the arrangement of the transfer robot TR, and FIG. 2B is a front view thereof The transfer robot TR comprises the robot main body 30, a first ball screw mechanism 40 for moving the robot main body 30 along the first transfer passage 10, and a second ball screw mechanism 50 for moving the robot main body 30 along the second transfer passage 20.

The first ball screw mechanism 40 comprises a screw shaft 41 disposed along the first transfer passage 10, a motor 42 for rotationally driving the screw shaft 41, and a carriage 43 having a ball nut portion to be threadedly connected to the screw shaft 41. A bracket 55 which supports one end of the second ball screw mechanism 50, is connected to the carriage 43 in a manner rotatable around a perpendicular axis.

The bracket 55 has a screw shaft 51 extending substantially along the second transfer passage 20, and this screw shaft 51 is arranged to be rotationally driven by a motor 52. A rail 58 is attached to the bracket 55 along the screw shaft 51. The rail 58 is supported on a carriage 56 at a position in the vicinity of that end of the rail 58 remoter from the first transfer passage 10, such that the rail 58 is rotatable around a perpendicular axis of rotation V extending in a perpendicular direction. The carriage 56 is movable along the second transfer passage 20 on a rail 57 extending along the second transfer passage 20.

The screw shaft 51 has a carriage 53 having a ball nut threadedly connected to the screw shaft 51, and the carriage 53 is arranged to move on the rail 58. The robot main body 30 is mounted on the carriage 53.

The robot main body 30 has a transfer stand 35 incorporating a vertically driving mechanism (not shown) and a rotationally driving mechanism (not shown), and a substrate holding unit 34 for holding a substrate W. The substrate holding unit 34 is arranged to be vertically moved by the vertically driving mechanism and to be rotationally driven around a perpendicular axis of rotation V0 by the rotationally driving mechanism.

The substrate holding unit 34 comprises a main body 33 to be rotationally driven around the axis of rotation V0 by the rotationally driving mechanism, and a pair of advancing/retreating arms 31, 32 disposed at the main body 33. The main body 33 incorporates an advance/retreat drive mechanism (not shown) for horizontally advancing/retreating this pair of advancing/retreating arms 31, 32.

The advancing/retreating arms 31, 32 have first arm portions 31a, 32a, second arm portions 31b, 32b and substrate holding hands 31c, 32c. The main body 33 has a substantially semicircular shape in plan view. The first arm portions 31a, 32a are attached, rotatably around perpendicular axes of rotation V11, V21, to both ends of the main body 33. The first arm portions 31a, 32a are driven, rotatably around the axes of rotation V11, V21, by the advance/retreat drive mechanism in the main body 33.

The first arm portions 31a, 32a form a so-called scalar robot. That is, the second arm portions 31b, 32b are rotated around perpendicular axes of rotation V12, V22 in association with the rotation of the first arm portions 31a, 32a. Thus, the advancing/retreating arms 31, 32 cause the first and second arm portions 31a, 32a; 31b, 32b to be bent and stretched, thus advancing and retreating the substrate holding hands 31c, 32c.

When contracted, the advancing/retreating arms 31, 32 hold the substrate holding hands 31c, 32c at a position where they are vertically overlapping each other (See FIG. 1). Accordingly, the second arm portion 31b of one advancing/retreating arm 31 is formed in a bend shape to prevent the second arm portion 31b from interfering with the substrate holding hand 32c of the other advancing/retreating arm 32.

By forwardly or reversely driving the motor 42 in the first ball screw mechanism 40, the end of the rail 58 of the second ball screw mechanism 50 at the side of the first transfer passage 10, can be moved along the first transfer passage 10. This enables the rail 58 to be swung in a horizontal plane. At this time, the axis of rotation V of the rail 58 is slightly moved along the second transfer passage 20. Such an movement is allowed by movement of the carriage 56 along the rail 57.

For moving the robot main body 30 along the second transfer passage 20, the motor 42 of the first ball screw mechanism 40 is controlled such that the carriage 43 is positioned on an extension line of the second transfer passage 20 (i.e., in the vicinity of the intermediate portion of the first transfer passage 10). Then, by forwardly or reversely driving the motor 52 of the second ball screw mechanism 50, the robot main body 30 can travel along the second transfer passage 20.

On the other hand, for moving the robot main body 30 along the first transfer passage 10, the motor 52 of the second ball screw mechanism 50 is controlled such that the carriage 53 is positioned in the first transfer passage 10 (i.e., at the end of the screw shaft 51 at the side of the first transfer passage 10). Then, by forwardly or reversely driving the motor 42 of the first ball screw mechanism 40, the rail 58 of the second ball screw mechanism 50 is swung around the axis of rotation V, causing the robot main body 30 to be moved along the first transfer passage 10.

By the rotation of the main body 33 around the axis of rotation V0, the vertical movement of the main body 33 and the bending and stretching of the advancing/retreating arms 31, 32, the robot main body 30 can transfer, in a position in any of the first and second transfer passages 10, 20, a substrate W held by the substrate holding hands 31c, 32c, to a unit (a cassette, a processing unit, the buffer unit or the like), and can also receive a substrate W from a unit by any of the substrate holding hands 31c, 32c.

According to the embodiment having the arrangement above-mentioned, the robot main body 30 can be moved along the first and second transfer passages 10, 20 formed in a T shape. Accordingly, the single transfer robot TR can have access successively to a plurality of units disposed along the first and second transfer passages 10, 20 at right angles to each other, and can carry substrates W in and out from such units. Thus, there can be provided a substrate processing apparatus which eliminates transferring a substrate W among a plurality of transfer robots, of which arrangement is simplified to reduce the cost, and which hardly gets out of order to provide a high reliability. It is not required to transfer a substrate among a pluralilty of transfer robots. This not only simplifies the program for operating the transfer robot TR, but also restrains particles from being generated. This prevents a substrate W from being contaminated, thus improving the substrate processing quality.

Figure 3A:
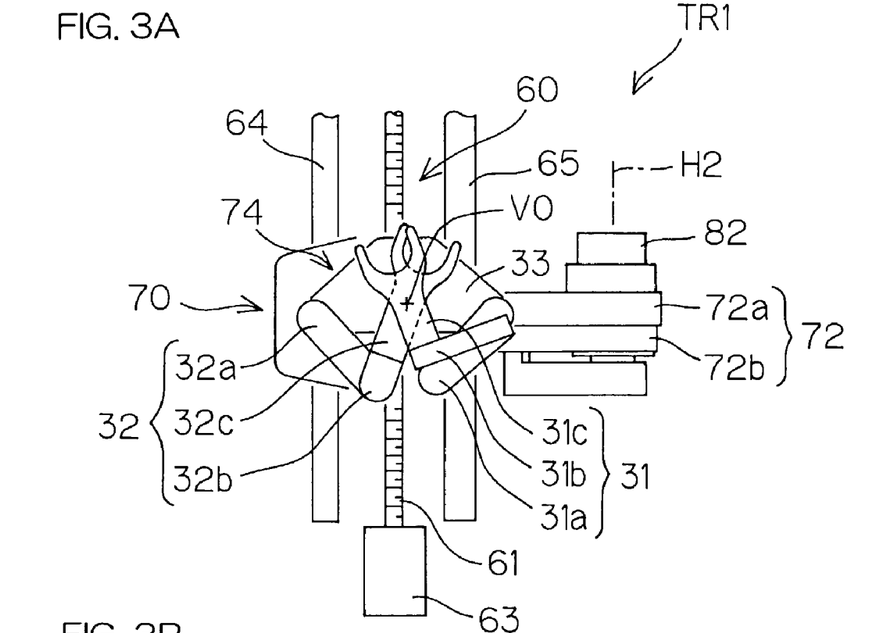
FIG. 3A and FIG. 3B are views illustrating the arrangement of a transfer robot to be used in a substrate processing apparatus according to a second embodiment of the present invention.
Figure 3B:
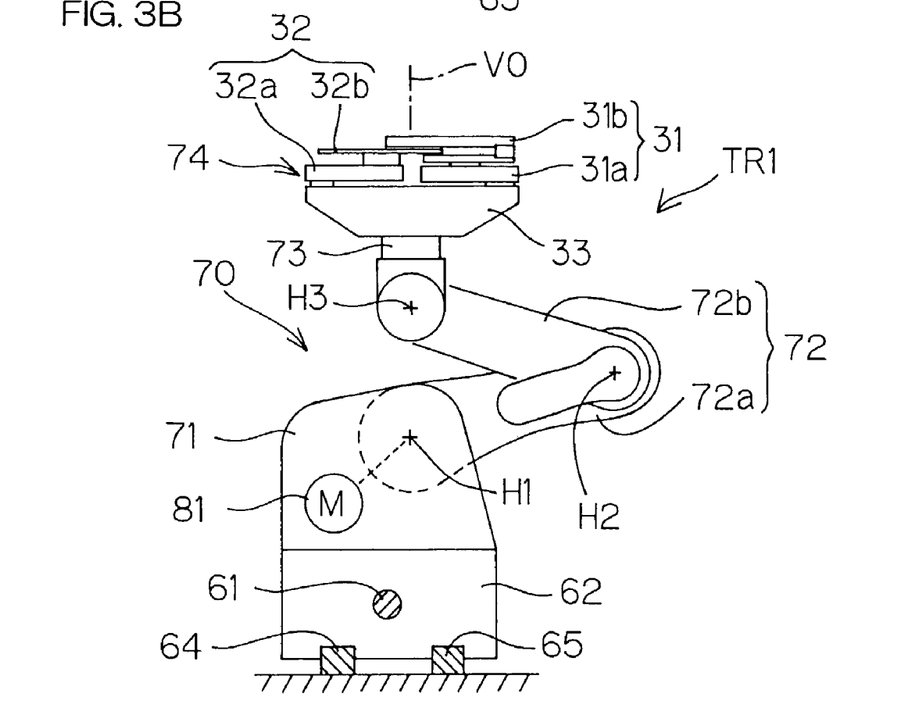

FIG. 3A is a plan view illustrating the arrangement of a transfer robot TR1 to be used in a substrate processing apparatus according to a second embodiment of the present invention, and FIG. 3B is a side view of FIG. 3A. Instead of the transfer robot TR, the transfer robot TR1 can be used in the substrate processing apparatus shown in FIG. 1.

The transfer robot TR1 has a ball screw mechanism 60 comprising a screw shaft 61 disposed along the second transfer passage 20 (See FIG. 1). This ball screw mechanism 60 comprises the screw shaft 61, a carriage 62 having a ball nut threadedly connected to the screw shaft 61, and a motor 63 for rotationally driving the screw shaft 61. Rails 64, 65 are parallel to the screw shaft 61 for guiding the movement of the carriage 62. Unlike the rail 58 in the first embodiment abovementioned, the rails 64, 65 are not swung but are fixed as extending in the direction along the second transfer passage 20.

A robot main body 70 is fixed onto the carriage 62. More specifically, the robot main body 70 comprises a base stand 71 fixed onto the carriage 62, a vertical multiarticular arm 72 attached to the base stand 71, a rotationally driving mechanism 73 attached to the vertical multiarticular arm 72, and a substrate holding unit 74 to be driven, rotatably around a perpendicular axis of rotation V0, by the rotationally driving mechanism 73. The substrate holding unit 74 has an arrangement similar to the substrate holding unit 34 of the transfer robot TR in the first embodiment. Accordingly, like parts in FIG. 3A and FIG. 3B are designated by like reference numerals used in FIG. 2A and FIG. 2B.

The vertical multiarticular arm 72 has a first arm 72a and a second arm 72b which are connected to each other in a manner rotatable around a horizontal axis of rotation H2. More specifically, the first arm 72a is connected to the base stand 71 in a manner rotatable around a horizontal axis of rotation H1. One end of the second arm 72b is connected to the other end of the first arm 72*a* in a manner rotatable around a horizontal axis of rotation H2. Further, the rotationally driving mechanism 73 is attached to the other end of the second arm 72*b* in a manner rotatable around a horizontal axis of rotation H3. The axes of rotation H1, H2, H3 are parallel to one another.

The base stand 71 has a motor 81 for rotating the first arm 72*a*. A motor 82 for rotationally driving the second arm 72*b* is disposed at the connection portion of the first and second arm 72*a*, 72*b*. The second arm 72*b* incorporates a drive force transmitting mechanism (not shown) for transmitting a drive force of the motor 82 toward the rotationally driving mechanism 73. Thus, provision is made such that the rotationally driving mechanism 73 always holds the substrate holding unit 74 in the same posture (which can hold a substrate W, for example, horizontally), even though the first arm 72*a* and the second arm 72*b* are rotated.

The rotationally driving mechanism 73 incorporates a motor (not shown). Upon receipt of a drive force from this motor, the rotationally driving mechanism 73 drives the substrate holding unit 74 rotatably around the perpendicular axis of rotation V0.

Figure 4:
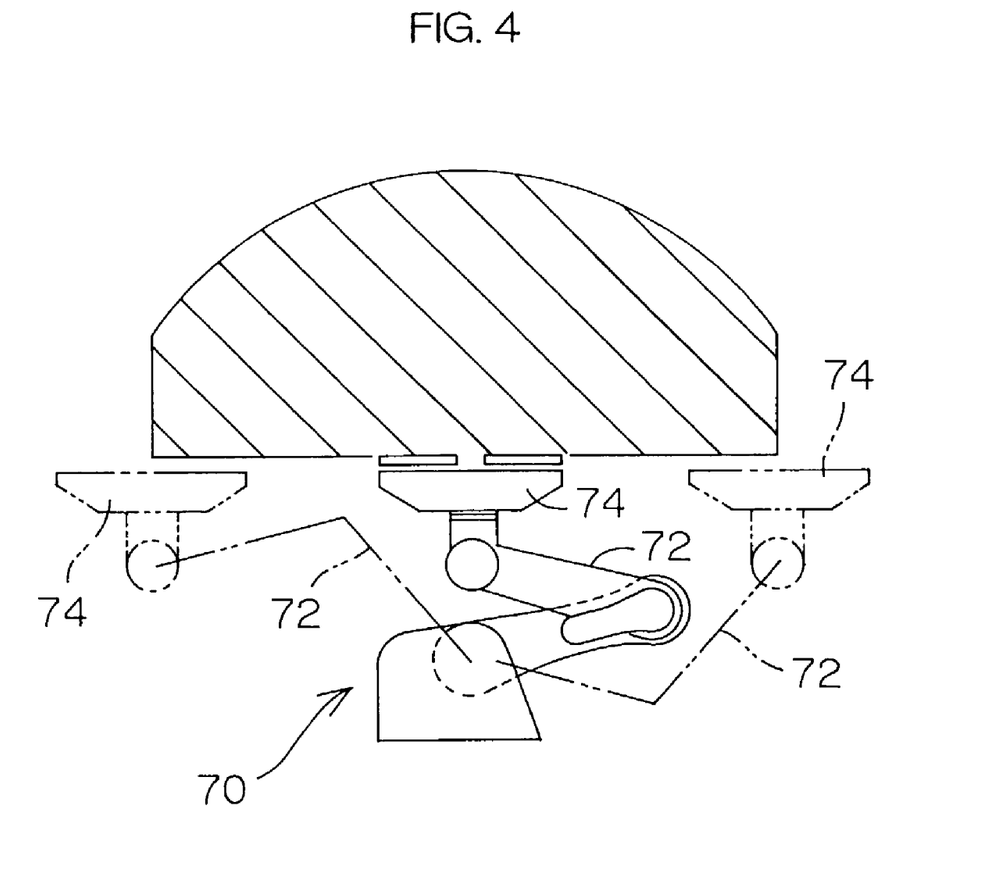
FIG. 4 is a view illustrating the access range of the transfer robot in FIG. 3.

According to the arrangement above-mentioned, the transfer robot TR1 can move the substrate holding hands 31*c*, 32*c* in horizontal and perpendicular directions within the range hatched in FIG. 4.

In accessing the robot main body 70 to a cassette C placed on any of the cassette placing units 11, 12 (See FIG. 1), the robot main body 70 is guided to the first transfer passage 10 by the ball screw mechanism 60. In such a state, the vertical multiarticular arm 72 is operated to cause the substrate holding unit 74 to face a cassette C of any of the cassette placing units 11, 12. Then, the rotationally driving mechanism 73 is operated to cause the advancing/retreating arms 31, 32 to face this cassette C. Then, the advance/retreat drive mechanism is operated to cause the advancing/retreating arms 31, 32 to access to the cassette C. Thus, a substrate W can be carried in/out from the cassette C. At the time of transfer of the substrate W between the cassette C and the advancing/retreating arms 31, 32, the substrate holding unit 74 is slightly vertically moved by the vertical multiarticular arm 72.

When accessing the robot main body 70 to any of the plating processing units 21~24, the back-face cleaning units 25, 26, the periphery cleaning units 27, 28 and the buffer unit 29 (See FIG. 1), the robot main body 70 is moved to the front of the target unit by the ball screw mechanism 60. The vertical multiarticular arm 72 is operated to cause the substrate holding unit 74 to be vertically moved to the height corresponding to the substrate carrying in/out port of the target unit. Also, the rotationally driving mechanism 73 is operated to rotate the substrate holding unit 74 such that the advancing/retreating arms 31, 32 face the target unit. In such a state, the advance/retreat drive mechanism is operated to cause the advancing/retreating arms 31, 32 to access to the target unit. Thus, a substrate W can be carried in and out. At the time of transfer of the substrate W between the target unit and the advancing/retreating arms 31, 32, the substrate holding unit 74 is slightly vertically moved by the vertical multiarticular arm 72.

As shown in FIG. 3B, when the substrate holding unit 74 is located at a relatively low position, the arms 72*a*, 72*b* of the vertical multiarticular arm 72 are in a folded state and accordingly, the vertical multiarticular arm 72 has a large width in a direction along the first transfer passage 10. To allow the vertical multiarticular arm 72 in such a state to travel along the second transfer passage 20, the second transfer passage 20 is required to have a large width. However, this is contrary to the demand for miniaturization of the footprint (occupied area) of the substrate processing apparatus. In this connection, this embodiment is therefore arranged such that, when moving the robot main body 70 along the second transfer passage 20, the substrate holding unit 74 is held at a relatively high position and the vertical multiarticular arm 72 is substantially stretched, thus reducing the width of the vertical multiarticular arm 72. Accordingly, the width of the second transfer passage 20 can be small, thus enabling the footprint of the substrate processing apparatus to be small.

According to the embodiment having the arrangement above-mentioned, too, the single transfer robot TR1 can have access to a cassette C of any of the two cassette placing units 11, 12 disposed along the first transfer passage 10, and can also have access to any of the plating processing units 21~24, the back-face cleaning units 25, 26, and the periphery cleaning units 27, 28 all disposed along the second transfer passage 20. Thus, this embodiment can produce effects similar to those produced by the first embodiment above-mentioned.

Figure 5A:
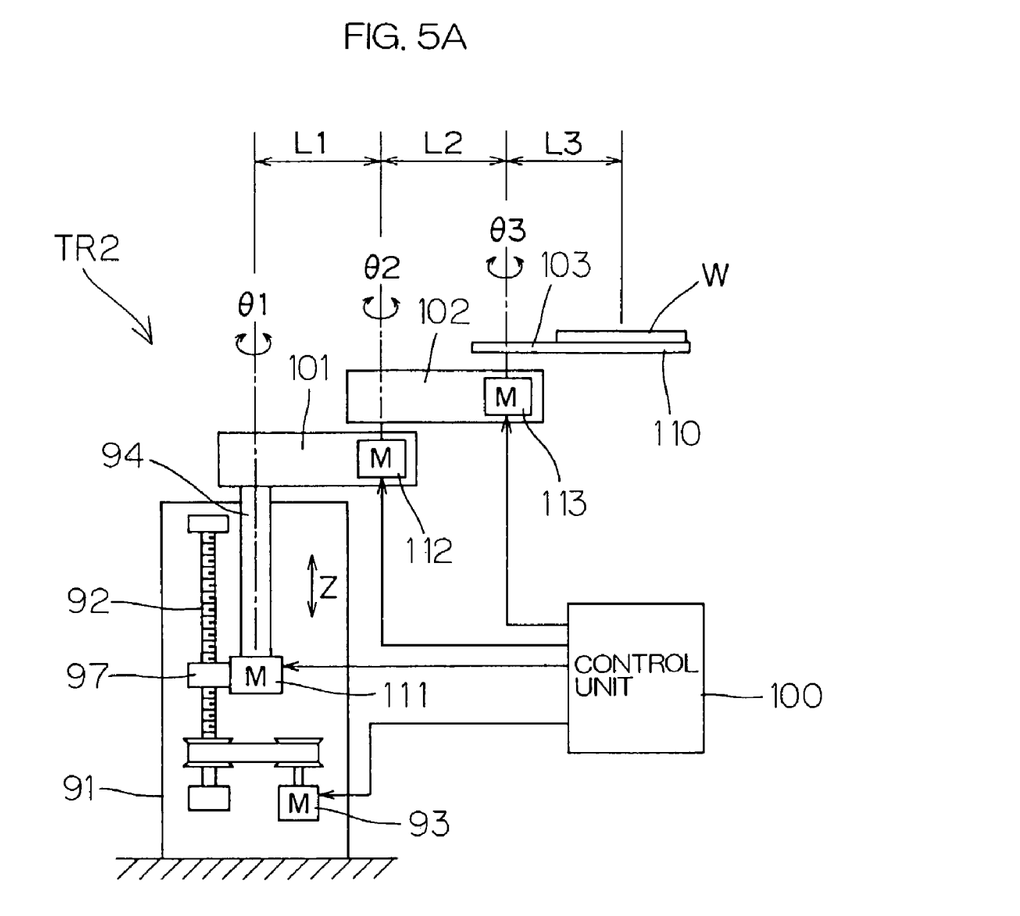
FIG. 5A and FIG. 5B are views illustrating the basic arrangement of a transfer robot to be used in a substrate processing apparatus according to a third embodiment of the present invention.
Figure 5B:
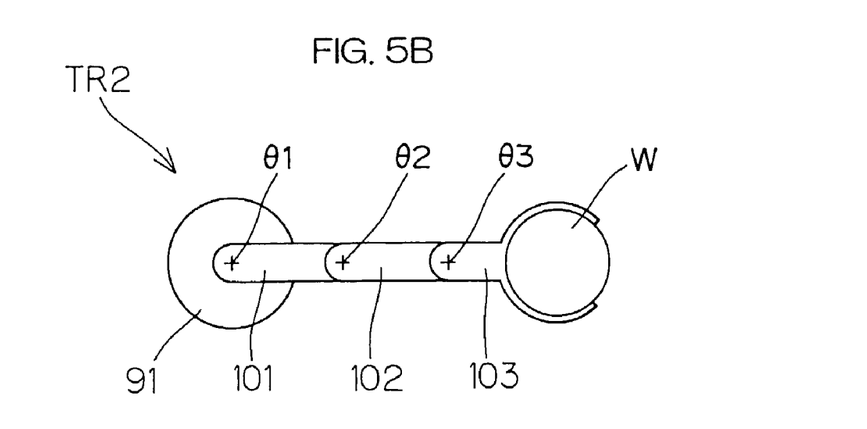

FIG. 5A is a conceptional section view illustrating the basic arrangement of a transfer robot TR2 to be used in the substrate processing apparatus in FIG. 1, instead of the transfer robots TR, TR1, and FIG. 5B is a conceptional plan view of the transfer robot TR2.

The transfer robot TR2 comprises a transfer stand 91 fixed to the frame at the bottom of the substrate processing apparatus, a first arm 101 connected to the transfer stand 91 in a manner rotatable around a first perpendicular axis of rotation θ1, a first motor 111 for driving this first arm 101 rotatably around the first perpendicular axis of rotation θ1, a second arm 102 connected to the first arm 101 rotatably around a second perpendicular axis of rotation θ2, a second motor 112 for driving the second arm 102 rotatably around the second perpendicular axis of rotation θ2, a third arm 103, also serving as substrate holding means, connected to the second arm 102 rotatably around a third perpendicular axis of rotation θ3, and a third motor 113 for driving the third arm 103 rotatably around the third perpendicular axis of rotation θ3. The tip of the third arm 103 is made in the form of a hand 110 for holding a substrate W.

The transfer stand 91 is provided in the vertical direction Z with a screw shaft 92, and provision is made such that a rotational force from a motor 93 is given to this screw shaft 92 through a timing belt. The screw shaft 92 is threadedly connected to a ball nut of a vertically moving block 97 arranged to be vertically moved while supporting the first motor 111 or the like. The vertically moving block 97 supports the first motor 111, and this first motor 111 rotates the first arm 101 around the first perpendicular axis of rotation θ1 through the rotational shaft 94.

The vertically moving block 97 is movably guided in the direction Z by guide means such as a guide rail (not shown).

The motor 93 and the first, second and third motors 111, 112, 113 are independently controlled in operation by a control unit 100.

According to the arrangement above-mentioned, the first motor 111, the second motor 112 and the third motor 113 are independently driven. Accordingly, the first arm 101, the second arm 102 and the third arm 103 (including the hand 110) can freely be rotated around the first perpendicular axis of rotation θ1, the second perpendicular axis of rotation θ2 and the third perpendicular axis of rotation θ3, respectively. By driving the motor 93, all the first arm 101, the second arm 102 and the third arm 103 can be vertically moved in the direction Z. Accordingly, a substrate W held by the third arm 103 can be transferred to an optional place at an optional angle within a predetermined range.

Figure 6:
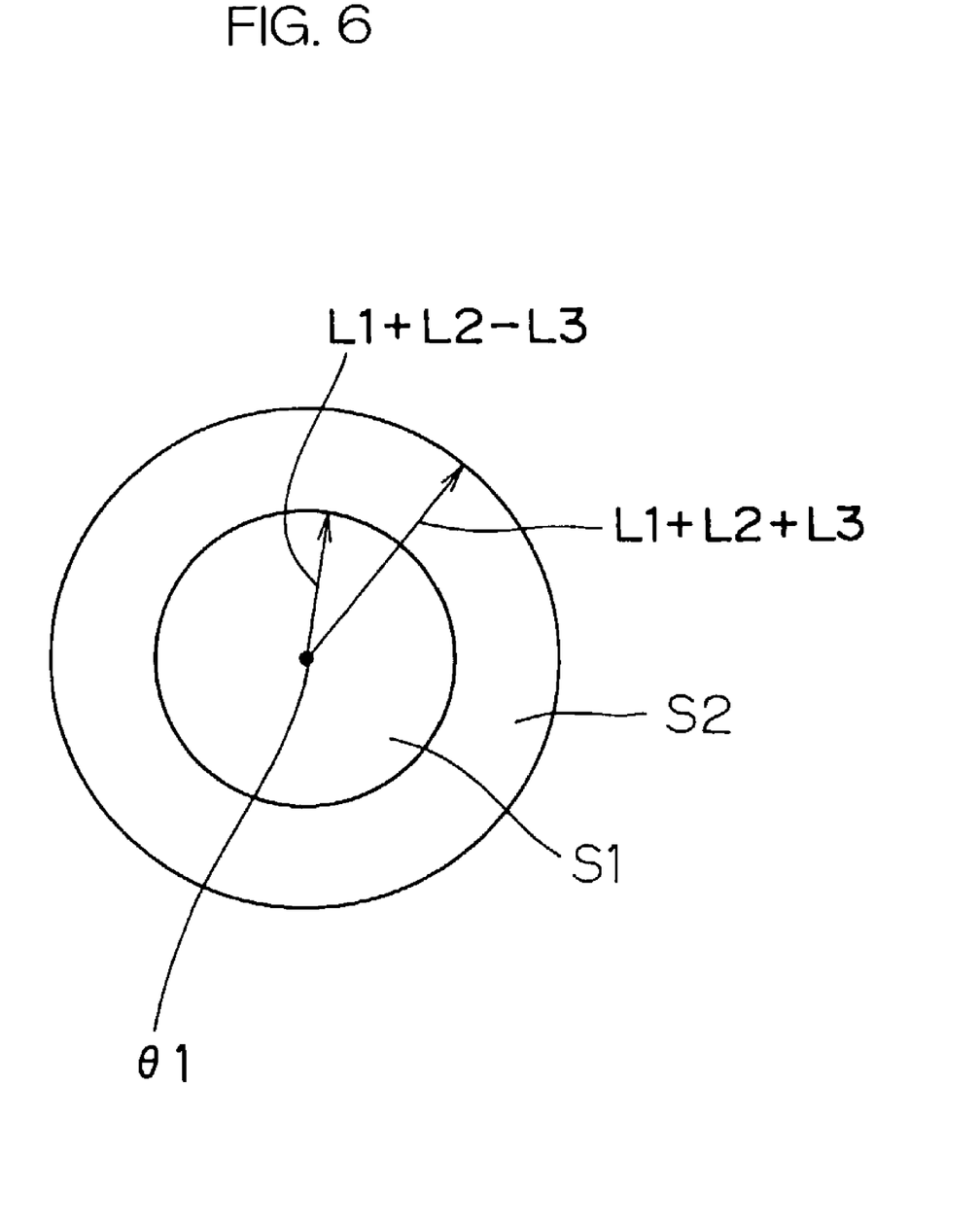
FIG. 6 is a view illustrating the access range of the transfer robot in FIG. 5.

More specifically, it is now supposed that the distance between the first and second perpendicular axes of rotation θ1, θ2 is referred to as a distance L1, the distance between the second and third perpendicular axes of rotation θ2, θ3 is referred to as a distance L2, and the distance between the third perpendicular axis of rotation θ3 and the center of a substrate W is referred to as a distance L3. Then, as shown in FIG. 6, the substrate W can be transferred to an optional place at an optional angle within a zone S1 of a circle having a radius of (L1+L2−L3) with the first perpendicular axis of rotation θ1 serving as the center. Further, in a zone S2 of a circle having a radius of (L1+L2+L3) even outside of the zone S1, the substrate W can be transferred to an optional place even though the angle of the substrate W is limited to a certain degree.

When the transfer robot TR2 having the arrangement above-mentioned is disposed in a proper position in the first transfer passage 10 or the second transfer passage 20 (See FIG. 1), the transfer robot TR2 can carry a substrate W in and out from a cassette C placed on any of the cassette placing units 11, 12 disposed along the first transfer passage 10, and can also carry a substrate W in and out from any of the units 21~29 disposed in the vicinity of the second transfer passage 20. Accordingly, this embodiment also procues effects similar to those discussed in connection with the first embodiment.

Instead of the third arm 103, there maybe used a substrate holding unit similar to the substrate holding unit 34, 74 used in the transfer robot TR, TR1 in the first/second embodiment. In such a case, one of the advancing/retreating arms 31, 32 can carry out a substrate W from a unit (including a cassette), and the other advancing/retreating arm 31, 32 can carry a substrate W in the unit. This achieves a high-speed carrying-in/out of a substrate W, particularly with respect to a processing unit.

Instead of the vertically driving mechanism such as the ball screw mechanism or the like disposed at the transfer stand 91, there may be disposed a vertically driving mechanism for vertically moving the second arm 102 with respect to the first arm 101, or a vertically driving mechanism for vertically moving the third arm 103 with respect to the second arm 102.

The vertically driving mechanism may not be limited to the ball screw mechanism, but may be of the scaler arm type having a pair of arms which are perpendicularly bent/stretched.

Further, the transfer stand 91 maybe moved along the second transfer passage 20 as necessary. For example, likewise in the second embodiment above-mentioned, the ball screw mechanism and the rails may be fixed, as extending along the second transfer passage 20, to the frame or the like of the substrate processing apparatus, and the transfer stand 91 may be moved on the rails. In such a case, the access range in the second transfer passage 20 can be broadened. This results in further increase in the number of the units 21~29 which can be disposed.

In the foregoing, three embodiments of the present invention have been discussed, but it is a matter of course that the present invention may also be embodied in other manner. For example, each of the embodiments above-mentioned has been discussed on a processing apparatus for plating the surface of a substrate W with metal. According to the present invention, however, the processing apparatus may be a substrate cleaning apparatus for cleaning the surface of a substrate W, an etching apparatus for etching a thin film formed on the substrate surface, a coating apparatus for coating the substrate W surface with a coating solution such as resist or the like, a developing apparatus for supplying a developing solution, or the like.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No. 2001-401198 filed on Dec. 28, 2001 with Japanese Patent Office, the disclosure of which is incorporated herein by reference.

What we claim is:

1. A substrate processing apparatus for processing a substrate while transferring the substrate among a plurality of units with which the substrate is to be processed or on which the substrate is to be placed, the substrate processing apparatus comprising:

a first horizontal linear transfer passage;

a second horizontal linear transfer passage connected to the first linear transfer passage at a longitudinal intermediate part of the first linear transfer passage, the second linear transfer passage crossing the first linear transfer passage at an angle of about 90° thereby forming a T-shaped transfer passage with the first linear transfer passage;

a first unit group disposed along the first linear transfer passage, the first unit group including a plurality of cassette placing units on each of which is placed a cassette capable of housing a substrate, the plurality of cassette placing units being arranged along the first linear transfer passage;

a second unit group disposed along the second linear transfer passage, the second unit group including a plurality of processing units for processing on a substrate, the plurality of processing units being arranged along the second linear transfer passage; and a single transfer robot capable of directly accessing all the cassette placing units and processing units of the first and second unit groups for transferring and receiving a substrate to and from the cassette placing units and processing units, the single transfer robot being arranged to transfer a substrate through the first and second linear transfer passages;

wherein each of the cassette placing units supports a cassette having a front thereof directed toward the first linear transfer passage, and the single transfer robot accesses the cassette from the first linear transfer passage to carry in a substrate to the cassette from the front thereof or to carry out a substrate from the cassette from the front thereof;

wherein the single transfer robot is of a vertical multiarticular arm type and includes a transfer stand, a first arm connected to the transfer stand in a manner rotatable around a first horizontal axis of rotation extending in a substantially horizontal direction, a first drive source for rotationally driving the first arm, a second arm connected to the first arm in a manner rotatable around a second horizontal axis of rotation substantially parallel to the first horizontal axis of rotation, a second drive source for rotationally driving the second arm, and a substrate holding mechanism connected to the second arm in a manner rotatable around a third horizontal axis of rotation substantially parallel to the first horizontal axis of rotation, the first arm being rotatable along a first vertical plane perpendicular to the first and second horizontal transfer passages, the second arm being rotatable along a second vertical plane perpendicular to the first and second horizontal transfer passages, the first and second arms forming a vertical multiarticular arm;

wherein the vertical multiarticular arm is operable for moving the substrate holding mechanism in horizontal and vertical directions along the first linear transfer passage, the vertical direction being perpendicular to said first and second horizontal transfer passages;

wherein the single transfer robot moves, in accessing a cassette on any one of the cassette placing units, the substrate holding mechanism to a position in front of the cassette along the first linear transfer passage by a function of the first and second arms of the vertical multiarticular arm;

wherein the single transfer robot moves, in accessing any one of the processing units, the transfer stand to a position in front of the processing unit along the second linear transfer passage so as to move the substrate holding mechanism along the second linear transfer passage;

wherein the first linear transfer passage is arranged such that the substrate holding mechanism can move, by a function of the first and second arms of the vertical multiarticular arm, therethrough to a position in front of a cassette on any one of the cassette placing units to carry in the substrate to the cassette or to carry out the substrate from the cassette; and wherein the second linear transfer passage is arranged such that the transfer stand and the vertical multiarticular arm can move therethrough to a position in front of any one of the processing units to carry in a substrate to the processing unit or to carry out a substrate from the processing unit, and the second linear transfer passage has a width corresponding to a width of the transfer robot in a state where the first and second arms of the vertical multiarticular arm are substantially extended in the vertical direction.

2. A substrate processing apparatus according to claim 1, wherein the transfer robot is arranged to take out an unprocessed substrate from the cassette placed on the cassette placing unit, to transfer the unprocessed substrate to the processing unit of the second unit group, and to carry a substrate, which has been processed by the processing unit of the second unit group, into the cassette placed on the cassette placing unit.

3. A substrate processing apparatus according to claim 1, wherein the processing units includes a plating processing unit disposed on one side of the second linear transfer passage, and a substrate cleaning unit disposed on the other side of the second linear transfer passage.

4. A substrate processing apparatus according to claim 1, wherein the processing units includes a plurality of plating processing units disposed along the second linear transfer passage on one side thereof.

5. A substrate processing apparatus according to claim 1, wherein the transfer robot includes a rail so disposed as to swing along a plane including the first and second lines, and a robot main body arranged to travel on the rail.

* * * * *